United States Patent
Juang et al.

(10) Patent No.: US 12,044,741 B1
(45) Date of Patent: Jul. 23, 2024

(54) DETECTION OF THERMAL ANOMALIES IN SERIALLY CONNECTED BATTERY CELLS

(71) Applicant: Amazon Technologies, Inc., Seattle, WA (US)

(72) Inventors: Larry W. Juang, Seattle, WA (US); Jianqi Shang, Mill Creek, WA (US); Jordan Joseph Proulx Cearns, Seattle, WA (US); Christien Samson Miller, Edmonds, WA (US); Marcelino Vazquez Montano, Issaquah, WA (US); Frederic Pierre Lacaux, Kirkland, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/851,804

(22) Filed: Jun. 28, 2022

(51) Int. Cl.
| | | |
|---|---|---|
| *G01R 31/3842* | (2019.01) | |
| *B60L 58/24* | (2019.01) | |
| *B64C 39/02* | (2023.01) | |
| *B64D 27/24* | (2024.01) | |
| *B64D 47/00* | (2006.01) | |
| *G01K 1/02* | (2021.01) | |
| *G01R 31/374* | (2019.01) | |
| *G01R 31/389* | (2019.01) | |
| *G01R 31/396* | (2019.01) | |
| *H02J 7/00* | (2006.01) | |
| *B60L 58/12* | (2019.01) | |
| *B64U 50/19* | (2023.01) | |

(52) U.S. Cl.
CPC .......... *G01R 31/389* (2019.01); *B64C 39/024* (2013.01); *B64D 27/24* (2013.01); *B64D 47/00* (2013.01); *G01K 1/026* (2013.01); *G01R 31/374* (2019.01); *G01R 31/3842* (2019.01); *G01R 31/396* (2019.01); *H02J 7/0013* (2013.01); *H02J 7/0029* (2013.01); *H02J 7/0047* (2013.01); *B60L 58/12* (2019.02); *B60L 58/24* (2019.02); *B60L 2200/10* (2013.01); *B64U 50/19* (2023.01)

(58) Field of Classification Search
USPC .......................................... 324/426, 432–435
See application file for complete search history.

(56) References Cited

U.S. PATENT DOCUMENTS

| | | | | |
|---|---|---|---|---|
| 2010/0244846 | A1* | 9/2010 | Desprez ............... | G01R 31/392 324/427 |
| 2022/0328878 | A1* | 10/2022 | Sawa .................... | H01M 4/485 |

* cited by examiner

*Primary Examiner* — Vincent Q Nguyen
(74) *Attorney, Agent, or Firm* — Athorus, PLLC

(57) ABSTRACT

Described are systems and methods for monitoring and detecting thermal conditions associated with individual cells of a battery. Embodiments of the present disclosure may monitor, detect, and protect against thermal anomalies that may be experienced at individual cells of a battery, without employing the use of thermal sensors (e.g., a thermocouple, thermistor, etc.). The exemplary systems and methods may be implemented in connection with a battery and/or battery pack having cells arranged in a serial configuration that may be employed in an aerial vehicle, such as an unmanned aerial vehicle (UAV). The described systems and methods detect thermal conditions associated with the individual cells of a battery by modeling each cell as an RC circuit and determining the resistance of each cell based on voltage and current measurements. The determined resistance can approximate and/or be representative of the temperature of the respective cell.

20 Claims, 8 Drawing Sheets

DETECTION OF THERMAL ANOMALIES IN SERIALLY CONNECTED BATTERY CELLS

BACKGROUND

Batteries are ubiquitous in modern electronic devices. However, despite the criticality of batteries in modern electronic devices, batteries can be susceptible to thermal conditions that can render the battery inoperable. For example, cells of a battery can suffer damage which can manifest as an internal short, which can in turn result in a thermal runaway condition. Such a battery failure can result in a catastrophic failure of the battery and can damage the electronic device. Accordingly, many electronic devices employ battery management systems to monitor the performance of the battery, facilitate protection of the battery, optimize performance of the battery, and the like. However, battery design can often make monitoring and protecting batteries difficult. For example, many batteries are often configured as multiple, interconnected, individual cells, and traditional monitoring systems and techniques typically are unable to monitor thermal conditions at each individual cell.

DETAILED DESCRIPTION

Figure 1:
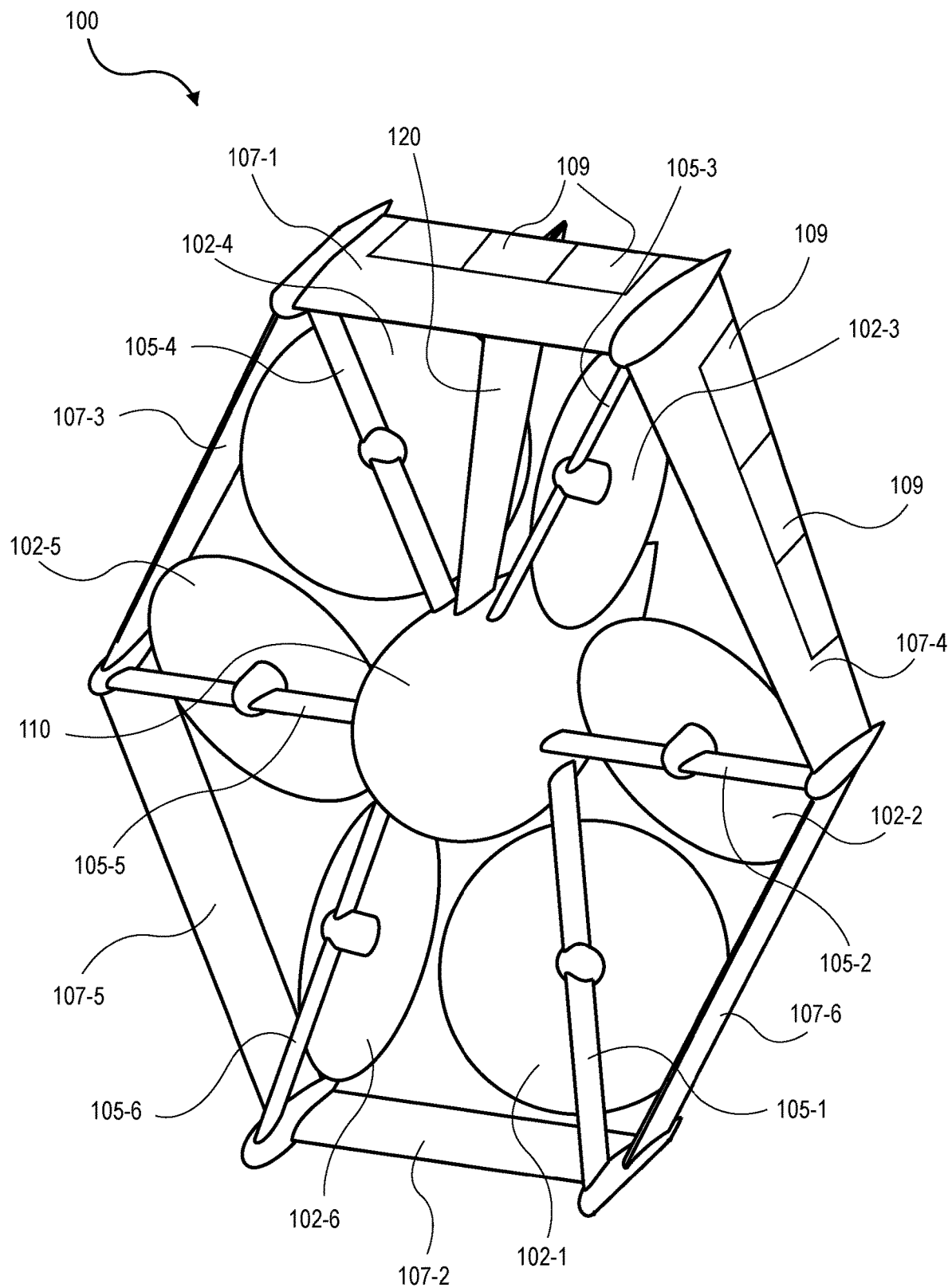
FIG. 1 illustrates an exemplary unmanned aerial vehicle, according to exemplary embodiments of the present disclosure.

As is set forth in greater detail below, embodiments of the present disclosure are generally directed to systems and methods for monitoring and detecting thermal conditions associated with individual cells of a battery. Exemplary embodiments of the present disclosure may be implemented to monitor, detect, and protect against thermal anomalies that may be experienced at each individual cell of a battery, without employing the use of thermal sensors (e.g., a thermocouple, thermistor, etc.) at each individual cell of the battery, such that a direct temperature measurement of each individual cell is not performed. The exemplary systems and methods may be implemented in connection with a battery and/or battery pack having cells arranged in a serial configuration that may be employed in an aerial vehicle, such as an unmanned aerial vehicle (UAV).

According to exemplary embodiments of the present disclosure, the monitoring and detection of thermal conditions associated with the individual cells of the battery can be performed by obtaining the voltage at each individual cell and the current flowing through the serially connected cells. Each individual cell can be modeled as an RC circuit, and based on the current and voltage measurements, a resistance of each individual cell can be determined. The resistance of each individual cell can approximate a relative temperature and/or be representative of an estimated temperature for each corresponding cell. The resistance and/or the estimated temperature can be compared against a fault condition threshold, and in the event the resistance and/or the estimated temperature trips the fault condition threshold (e.g., the resistance is below a threshold or the temperature is above a threshold), a fault condition may be triggered.

Exemplary embodiments of the present disclosure also facilitate determining and/or modeling a relationship between the resistance of an individual battery cell and a temperature of the individual battery cell. For example, the performance and/or characteristics of each individual cell may be determined based on testing and/or simulations (e.g., hybrid pulse power characterization (HPPC) testing, etc.) performed under certain standardized conditions (e.g., ambient temperature, state of charge (SOC), battery age, battery C-rate, and the like). Alternatively and/or in addition, each individual cell of the battery can be modeled as an R-RC circuit, and a filtering technique (e.g., Kalman filtering, least mean squares (LMS) filtering, etc.) may be employed to recursively determine the resistance of each individual cell, which can approximate a relative temperature and/or be representative of an estimated temperature of each individual cell.

Exemplary embodiments of the present disclosure can also facilitate determining an impact that operating parameters, such as the state of charge (SOC) and the age of the battery, may have on the resistance and/or temperature of each individual cell of the battery. Accordingly, the SOC and the age of the battery can be used to determine an adjustment factor (e.g., a multiplier, etc.) that can be applied to adjust the resistance and/or temperature of each individual cell of the battery based on operating parameters, such as the SOC and/or the age of the battery.

Advantageously, exemplary embodiments of the present disclosure may be implemented in a battery management system that introduces little additional complexity and no additional hardware. Further, the monitoring and detection of thermal conditions of each individual cell of a battery, provided by exemplary embodiments of the present disclosure, can facilitate comprehensive cell level coverage for each individual cell of a battery, without requiring a corresponding thermal sensor for each individual cell of the battery. Accordingly, exemplary embodiments of the present disclosure can provide thermal anomaly detection coverage for each individual cell without having to take a direct temperature measurement of each individual cell, thereby obviating the need for having a thermal sensor disposed at each individual cell so as to reduce cost and complexity.

Although embodiments of the present disclosure are primarily described with respect to aerial vehicles and UAVs, exemplary embodiments of the present disclosure can be applicable to any other types of electronic devices and/or vehicles utilizing a battery as a power source that can benefit from monitoring and detection of thermal conditions on an individual cell basis for the battery.

FIG. 1 illustrates an exemplary unmanned aerial vehicle 100, according to exemplary embodiments of the present disclosure.

As shown in FIG. 1, aerial vehicle 100 may include a ring wing that is substantially hexagonal in shape and that surrounds a plurality of propulsion mechanisms. Aerial vehicle 100 may include six propulsion mechanisms 102-1, 102-2, 102-3, 102-4, 102-5, and 102-6 spaced about fuselage 110 of aerial vehicle 100. Although aerial vehicle 100 is shown with six propulsion mechanisms 102, aerial vehicle 100 may include any number of propulsion mechanisms 102. Propulsion mechanisms 102 may include motors, propellers, or any other form of propulsion and may each be controlled by a respective electronic speed controller. For example, one or more of propulsion mechanisms 102 of aerial vehicle 100 may utilize fans, jets, turbojets, turbo fans, jet engines, and/or the like to maneuver the aerial vehicle. Generally described, propulsion mechanism 102, as used herein, can include any form of propulsion mechanism that is capable of generating a force sufficient to maneuver aerial vehicle 100, alone and/or in combination with other propulsion mechanisms. Furthermore, in certain implementations, propulsion mechanisms 102 may be configured such that their individual orientations may be dynamically modified.

Likewise, while the examples herein describe the propulsion mechanisms being able to generate force in either direction, in some implementations, the propulsion mechanisms may only generate force in a single direction. However, the orientation of the propulsion mechanisms may be adjusted so that the force can be oriented in a positive direction, a negative direction, and/or any other direction.

In the illustrated implementation, aerial vehicle 100 can also include ring wing 107 having a substantially hexagonal shape that extends around and forms the perimeter of aerial vehicle 100. In the illustrated example, ring wing 107 can include six segments 107-1, 107-2, 107-3, 107-4, 107-5, and 107-6 that are joined at adjacent ends to form ring wing 107 around aerial vehicle 100. Each segment of ring wing 107 has an airfoil shape to produce lift when aerial vehicle 100 is oriented and moving in a direction that is substantially horizontal. As illustrated, and discussed further below, the ring wing is positioned at a canted angle with respect to fuselage 110 such that lower segment 107-2 of ring wing 107 acts as a front wing as it is toward the front of the aerial vehicle when oriented as shown and moving in a horizontal direction. Upper segment 107-1 of ring wing 107, which has a longer chord length than lower segment 107-2 of ring wing 107, is positioned, in a horizontal orientation, further back relative to lower segment 107-2, and thus can act as a rear wing.

Ring wing 107 can be secured to fuselage 110 by motor arms 105. In this example, motor arms 105-1, 105-2, 105-3, 105-4, 105-5, and 105-6 are coupled to fuselage 110 at one end and are coupled to ring wing 107 at a second end, thereby securing ring wing 107 to fuselage 110. In other implementations, less than all of motor arms 105 may extend from fuselage 110 and couple to ring wing 107.

As illustrated, propulsion mechanisms 102 may be oriented at different angles with respect to each other. For example, propulsion mechanisms 102-2 and 102-5 can be aligned with fuselage 110 such that the force generated by each of propulsion mechanisms 102-2 and 102-5 is in-line or in the same direction or orientation as the fuselage. In the illustrated example, aerial vehicle 100 is oriented for high-speed, fixed-wing, wing-borne, horizontal flight such that the fuselage is oriented horizontally in the direction of travel. In such an orientation, propulsion mechanisms 102-2 and 102-5 provide horizontal forces, also referred to herein as thrusting forces, and act as thrusting propulsion mechanisms.

In comparison to propulsion mechanisms 102-2 and 102-5, each of propulsion mechanisms 102-1, 102-3, 102-4, and 102-6 are offset or angled with respect to the orientation of fuselage 110. Accordingly, when aerial vehicle 100 is oriented for horizontal flight, propulsion mechanisms 102-1, 102-3, 102-4, and 102-6 may be used to provide thrust in a non-horizontal direction to cause the aerial vehicle to pitch, yaw, roll, heave and/or sway. In other implementations, during horizontal flight, propulsion mechanisms 102-1, 102-3, 102-4, and 102-6 may be disabled such that they do not produce any forces and aerial vehicle 100 may be propelled aerially in a horizontal direction as a result of the lifting force from the aerodynamic shape of the ring wing 107 and the horizontal thrust produced by propulsion mechanisms 102-2 and 102-5.

The angle of orientation of each of the propulsion mechanisms 102-1, 102-2, 102-3, 102-4, 102-5, and 102-6 may vary for different implementations. Likewise, in some implementations, the offset of the propulsion mechanisms 102-1, 102-2, 102-3, 102-4, 102-5, and 102-6 may each be the same, with some oriented in one direction and some oriented in another direction, may each be oriented different amounts, and/or in different directions.

Further, fuselage 110 may be sized, dimensioned, and/or configured to house and/or store one or more components of aerial vehicle 100, such as an aerial vehicle control system, a power module, a power supply (e.g., one or more batteries), a battery management system (which may be implemented as part of the aerial vehicle control system and/or as a separate and discrete system), and/or a payload that is transported by aerial vehicle 100. Preferably, the power supply may include one or more batteries and/or battery packs made up of numerous battery cells connected in serial. Likewise, in some implementations, the power supply may be removable and replaceable with different second power supplies for different flight durations, different total vehicle weight, replacement, and the like.

Figure 2:
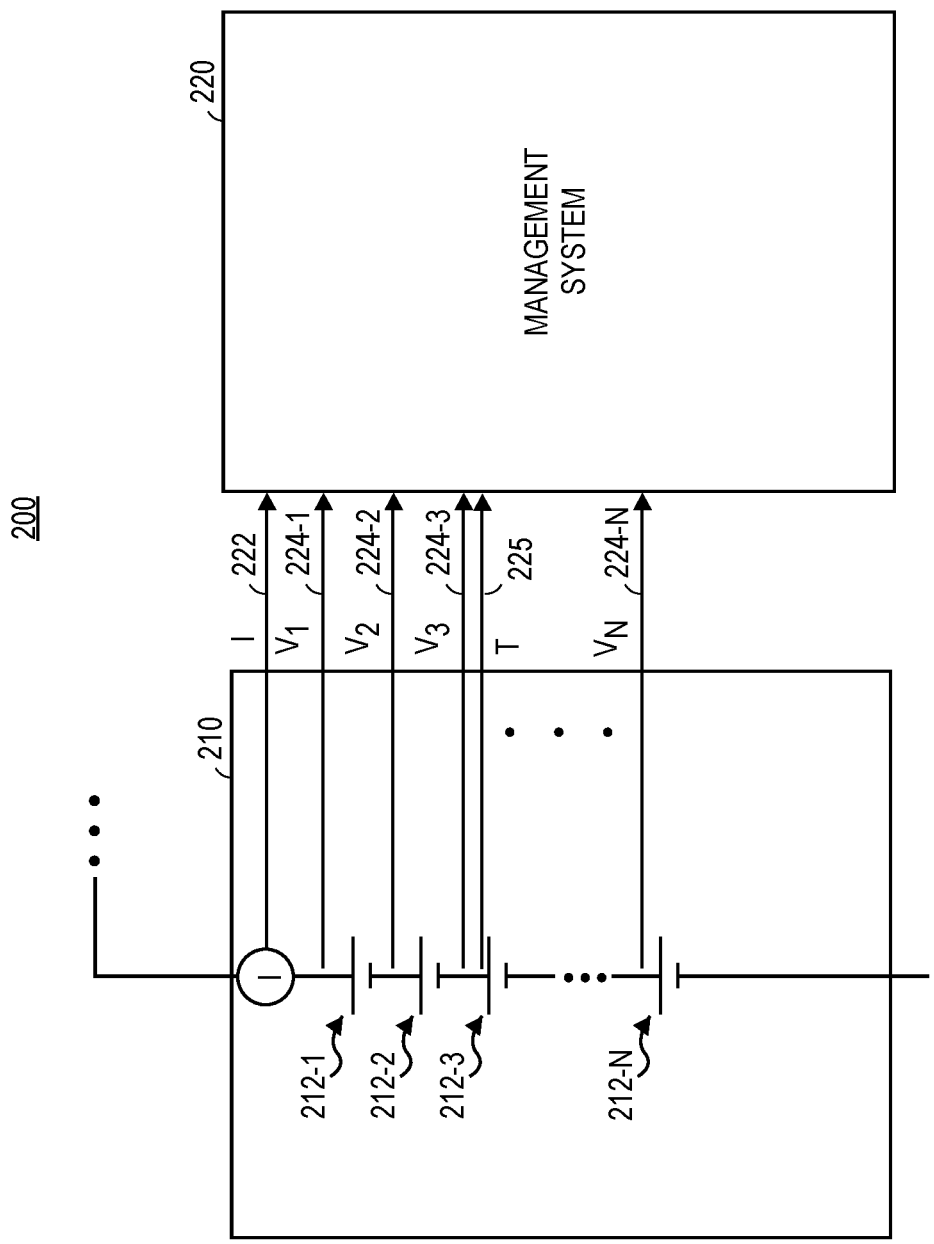
FIG. 2 is a block diagram illustrating a simplified exemplary power supply system, according to exemplary embodiments of the present disclosure.

FIG. 2 is a block diagram illustrating a simplified exemplary power system 200, according to exemplary embodiments of the present disclosure.

As shown in FIG. 2, exemplary power system 200 can include power supply 210 and power supply management system 220. In exemplary implementations, exemplary power system 200 may represent a power system configuration that may be used to power an aerial vehicle, such as a UAV (e.g., aerial vehicle 100). According to exemplary embodiments of the present disclosure, power supply 210 can include one or more batteries that include multiple individual cells 212 arranged in a serial arrangement, and power supply management system 220 can include a battery management system configured to monitor and protect power supply 210. As illustrated in FIG. 2, power supply 210 may include any number of individual cells 212-1, 212-2, 212-3, through 212-N.

Further, power supply management system 220 may be configured to obtain certain operating characteristics and/or parameters associated with power supply 210. For example, power supply management system 220 may obtain an SOC associated with power supply 210, an age (e.g., number of cycles, calendar age, etc.) associated with power supply 210, a current C-rate associated with power supply 210, current measurement 222, and voltage measurements 224. For example, power supply management system 220 may include a current sensing device configured to measure current measurement 222, which may represent the current provided by power supply 210, to power supply management system 220. Further, power supply management system 220 may also include a voltage sensing device disposed at each cell 212 that is configured to measure and provide voltage measurements 224, which may represent the voltage of each individual cell 212 of power supply 210, to power supply management system 220. As power supply 210 may include any number of individual cells 212, power supply management system 220 may include any corresponding number of voltage measurement devices configured to obtain any corresponding number of voltage measurements 224 (e.g., voltage measurements 224-1, 224-2, 224-3, through 224-N). Accordingly, power supply management system 220 may be configured to obtain a voltage associated with each cell 212 of power supply 210.

Additionally, power supply management system 220 may also include one or more thermal sensors (e.g., thermocouples, thermistors, etc.) via which power supply management system 220 may obtain temperature measurement 225 associated with cell 212-3 of power supply 210. However, unlike voltage measurements 224 provided by voltage sensing devices, thermal sensors are typically sparsely included in power supply 210 and are not provided for each individual cell 212 of power supply 210 (e.g., one thermal sensor for a certain number of cells).

In operation, power system 200 may be employed in an aerial vehicle (or other electronic device), such as a UAV, to provide power to the aerial vehicle to facilitate the operation of the aerial vehicle. In the exemplary implementation illustrated in FIG. 2, power supply 210 may include one or more batteries, battery packs, and the like, with each of the one or more batteries and/or battery packs including individual cells 212 arranged in a serial configuration. Further, power supply management system 220 may be configured to obtain current measurement 222, which can correspond to the current produced by the serially configured individual cells 210 and voltage measurements 224, which can correspond to the voltage at each corresponding individual cell 210.

According to exemplary embodiments of the present disclosure, each individual cell 212 may be modeled as an R-RC circuit, and power supply management system 220 may be configured to approximate and/or determine an estimated temperature of each individual cell 212 based on the current measurement 222 and voltage measurements 224. For example, in connection with representative individual cell 212-1, power supply management system 220 may be configured to determine a resistance of cell 212-1 based on current measurement 222 and voltage measurement 224-1, which can approximate a relative temperature and/or be representative of an estimated temperature. In one exemplary implementation, cell 212-1 may be modeled as an R-RC circuit, and the resistance of cell 212-1 may be determined using a filtering technique (e.g., Kalman filtering, least mean squares filtering, and the like). The resistance can then be used to approximate and/or determine an estimated temperature. Accordingly, the resistance and/or temperature may be compared against a fault condition threshold to detect and/or monitor for thermal anomalies.

According to exemplary embodiments of the present disclosure, power supply management system 220 may be configured to continuously monitor current measurement 222 and voltage measurements 224 during use of power supply 210 (e.g., during aerial operation of a UAV, etc.). The continuously monitoring of current measurement 222 and voltage measurements 224 can be used to continuously determine and monitor the resistance associated with each individual cell 212. Additionally, power supply management system 220 may also continue to monitor other operating characteristics and/or parameters associated with power supply 210. For example, power supply management system 220 may also continuously monitor an SOC associated with power supply 210, a current C-rate associated with power supply 210, and the like. The resistances associated with each individual cell 212 and the other operating characteristics and/or parameters can in turn be used to approximate and/or determine an estimated temperature associated with each individual cell 212, thereby facilitating detection of a thermal anomaly in connection with one or more of each individual cell 212. Accordingly, power supply management system 220 can facilitate early detection of thermal anomalies in any of individual cells 212 prior to a catastrophic failure of power supply 210, while providing coverage for each individual cell 212.

According to exemplary embodiments of the present disclosure, detection of a thermal anomaly may be performed by comparing the resistance and/or estimated temperature of each individual cell 212 against a fault condition threshold value. In the event that the resistance is below the fault condition threshold value and/or estimated temperature trips the fault condition threshold value (e.g., the resistance is below a threshold or the temperature is above a threshold), a fault condition may be triggered, and remediation measure may be taken. According to certain aspects of the present disclosure, comparison of the resistance and/or estimated temperature of each individual cell 212 against the fault condition threshold may include a delay, count, or other mechanism to ensure that the thermal anomaly is persistent prior to triggering a fault condition. Further, the fault condition threshold may be adjusted in view of certain operating characteristics and/or parameters associated with power supply 210. For example, the fault condition threshold may be adjusted based on the state of charge (SOC) of power supply 210, the age of power supply 210, a battery current C-rate, and the like. Alternatively and/or in addition, power supply management system 220 may not determine the resistances and/or monitor for thermal anomalies via a comparison of the resistance and/or estimated temperature of each individual cell 212 against the fault condition threshold if the SOC charge of power supply 210 is outside of a range (e.g., 10% to 90%, 15% to 85%, 20% to 80%, 25% to 75%, etc.), the age of power supply 210 is above a threshold value, and/or the battery current C-rate is below a C-rate threshold vale (e.g., below 0.1 C, below 0.15 C, below 0.2 C, below 0.25 C, below 0.5 C, below 1.0 C, etc.).

Figure 3:
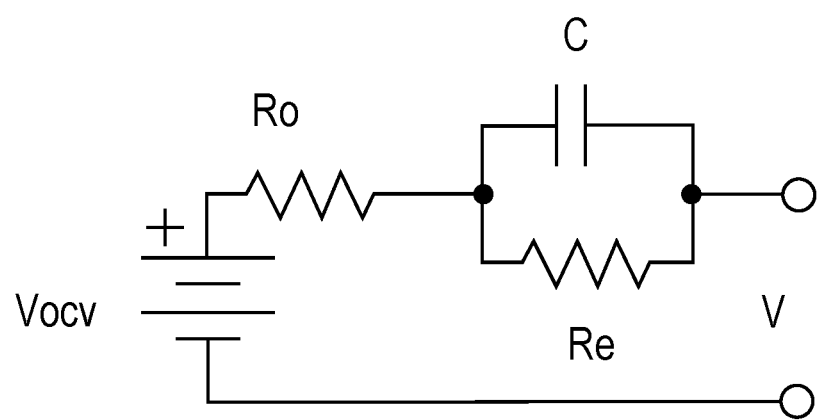
FIG. 3 is an illustration of an exemplary R-RC circuit that may be used to model an individual cell of a battery, according to exemplary embodiments of the present disclosure.

FIG. 3 is an illustration of an exemplary R-RC circuit 300 that may be used to model an individual cell of a battery, according to exemplary embodiments of the present disclosure.

As shown in FIG. 3, exemplary R-RC circuit 300 may represent an equivalent circuit of each individual battery cell (e.g., cells 212) that may be used to model each individual cell of a battery in facilitating monitoring and detection of a thermal anomaly associated with each individual cell of a battery. In exemplary R-RC circuit 300 illustrated in FIG. 3, $V_{OCV}$ can represent the open circuit voltage of the cell being modeled, $R_0$ can represent that line resistance, the RC element (i.e., C and $R_e$) can approximate the electrode charge transfer and the double layer capacitance of the battery, and V can represent the output voltage across the cell. According to exemplary embodiments of the present disclosure, each individual cell of a battery (e.g., connected in series, etc.) may be modeled using exemplary R-RC circuit 300.

In exemplary implementations of the present disclosure, a battery management system (e.g., power supply management system 220) may continuously measure and sample the output voltage V of exemplary R-RC circuit 300 (e.g., voltage measurements 224) and the current output by the cells arranged in a serial configuration (e.g., current measurement 222). According to exemplary embodiments of the present disclosure, exemplary R-RC circuit 300 can be viewed as a physical filter, and, using Euler's forward method of discretization, exemplary R-RC circuit 300 can be represented as a discretized time series as:

$$V[k] = -a_1 V[k-1] + (1+a_1) V_{ocv} - b_0 I[k] - b_1 I[k-1] \quad (1)$$

where:

| Discrete Parameter | Continuous Parameter |
|---|---|
| $b_0$ | $R_0$ |
| $b_1$ | $-R_0 + \dfrac{T(R_0 + R_e)}{R_e C}$ |
| $a_1$ | $-1 + \dfrac{T}{R_e C}$ | and T may represent the sampling time of the battery management system associated with the current and voltage measurements obtained by the battery management system. According to exemplary embodiments of the present disclosure, a filtering technique (e.g., Kalman filtering, LMS filtering, etc.) may be utilized to recursively estimate the parameters associated with exemplary R-RC circuit 300. For example, Equation (1) above can be rewritten in state space form as:

$$V_t[k] + a_1 V_t[k-1] = [1 + a_1, -I[k], -I[k-1]] \begin{bmatrix} V_{ocv} \\ b_0 \\ b_1 \end{bmatrix} \quad (2)$$

Accordingly, the filtering technique (e.g., Kalman filtering, LMS filtering, etc.) can be utilized to recursively estimate the values of parameters $V_{OCV}$, $b_0$, and $b_1$. As noted in the table above, $b_0$ approximates the value of the line resistance $R_0$ of exemplary R-RC circuit 300. Accordingly, in view of the correspondence of $b_0$ with line resistance $R_0$ and the relationship between line resistance $R_0$ and temperature, $b_0$ can be utilized to estimate the resistance and/or temperature of each individual cell. Further, the battery management system can compare the resistance and/or temperature of each individual cell against a fault condition threshold to determine whether a thermal fault condition is triggered based on the estimated resistance and/or temperature. According to certain aspects of the present disclosure, comparison of the resistance and/or temperature of each individual cell against the fault condition threshold may include a delay, count, filter, or other mechanism to ensure that the thermal anomaly is persistent for a predetermined period prior to triggering of the fault condition.

Figure 4A:
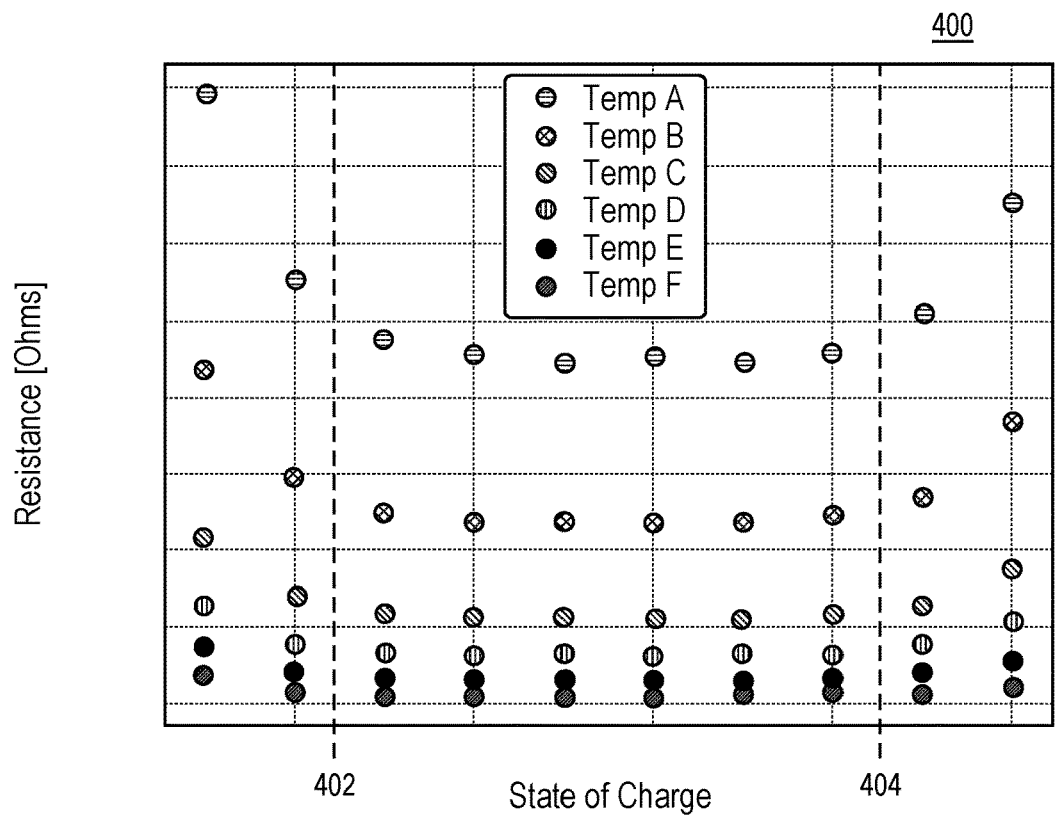
FIGS. 4A and 4B are exemplary graphs illustrating relationships between resistance and state of charge and/or temperature, according to exemplary embodiments of the present disclosure.
Figure 4B:
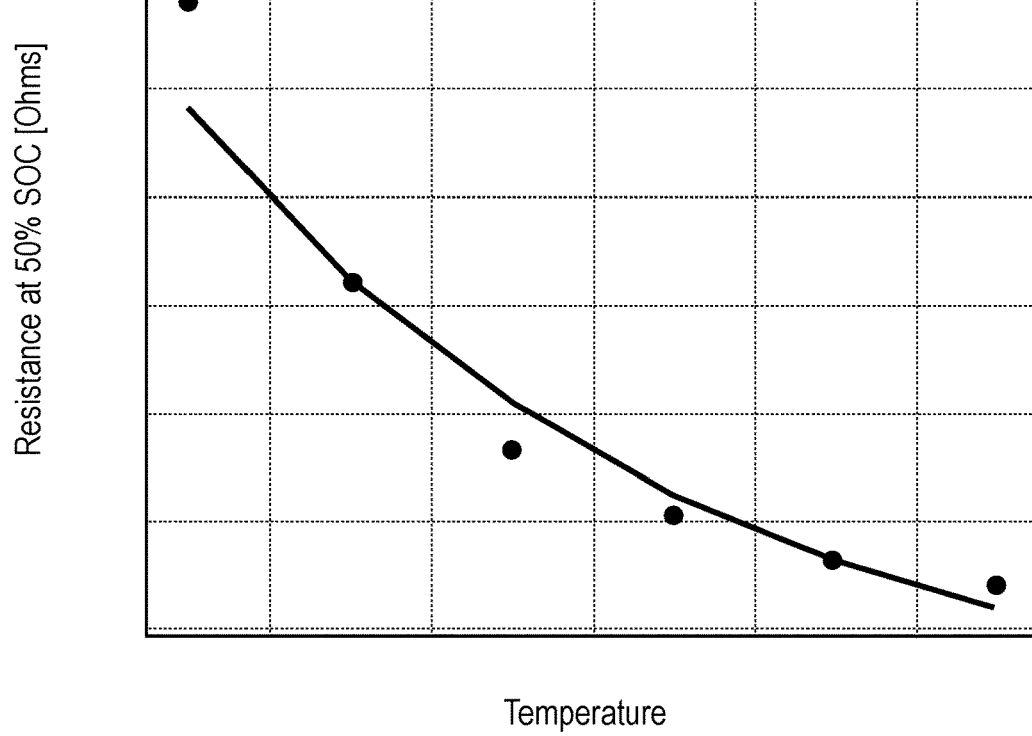

FIGS. 4A and 4B are exemplary graphs illustrating relationships between resistance and state of charge and/or temperature, according to exemplary embodiments of the present disclosure.

FIG. 4A is an illustration of an exemplary plot 400 demonstrating the relationships between resistance and state of charge and resistance and temperature, according to exemplary embodiments of the present disclosure, and FIG. 4B is an illustration of an exemplary plot 450, demonstrating a relationship between resistance and temperature at a particular SOC. In plot 400, Temp A may correspond to a lowest relative temperature and Temp F may correspond to a highest relative temperature, with Temps B, C, D, and E corresponding to progressively higher relative temperatures, such that Temp A<Temp B<Temp C<Temp D<Temp E<Temp F. Accordingly, as shown in FIG. 4A, relatively higher temperatures correspond to relatively lower resistances, and relatively lower temperatures correspond to relatively higher resistances.

As shown in FIGS. 4A and 4B, resistance may have an inverse relationship relative to temperature such that lower relative temperatures have a higher relative resistance and higher relative temperatures have a relatively lower resistance. According to certain aspects of the present disclosure, plot 450, which illustrates the relationship of resistance relative to temperature, can be approximated by the Arrhenius equation, which can be represented as:

$$k = A e^{\frac{-E_a}{RT}}$$

where k can represent a rate constant, A can represent a pre-exponential factor, $E_a$ can represent an activation energy, R can represent a universal gas constant, and T can represent the absolute temperature.

Additionally, as shown in FIG. 4A, plot 400 illustrates that the resistance of a battery cell may be substantially constant relative to its state of charge (SOC) within a certain range of its SOC and may be more variable outside of that range. Specifically, resistance of an individual cell may be substantially constant between lower SOC threshold 402 and upper SOC threshold 404, while being relatively more variable relative to SOC below lower SOC threshold 402 and above upper SOC threshold 404. For example, resistance of a battery cell may exponentially increase below lower SOC threshold 402 and above upper SOC threshold 404. Similarly, resistance of a battery cell may also be variable as a function of the battery's age. For example, the resistance of a battery cell may increase substantially (e.g., 5%, 10%, 15,%, 20%, 25%, 30%, etc.) toward the end of a battery's life.

According to exemplary embodiments of the present disclosure, the relationships between resistance and state of charge and resistance and temperature, as illustrated in plots 400 and 450 shown in FIGS. 4A and 4B, may be obtained through testing and/or simulations (e.g., hybrid pulse power characterization (HPPC) testing, etc.) performed under certain standardized conditions (e.g., at particular temperatures, states of charge (SOC), battery age, battery C-rate, and the like). For example, the relationships illustrated in plot 400 shown in FIG. 4A may have been acquired via HPPC testing, at various temperatures (e.g., at temperatures A-F) and at various SOCs (e.g., at 5%, 10%, 15%, 20%, 25%, 30%, 40%, 50%, 75%, 80%, 90%, 95%, etc.) at a particular battery C-rate (e.g., 0.5 C, 0.75 C, 1.0 C, 1.25 C, 1.5 C, 1.75 C, 2.0 C, etc.).

In view of the variability of resistance relative to SOC and age of a battery cell, according to certain aspects of the present disclosure, testing and/or simulations can be performed across multiple batteries and/or cells at various SOCs, ages, temperatures, etc. to obtain data reflecting the variability of resistance as a function of SOCs, ages, etc. The data can be used to generate one or more look-up tables including various adjustment factors, which may be used in the determination of resistance, temperature, and/or fault condition thresholds. For example, resistance information for various SOCs can be compiled and aggregated to generate a resistance estimation SOC look-up table as a function of SOC. The resistance estimation SOC look-up table can include adjustment factors for corresponding SOCs of a battery, which can be applied in the determination of the resistance, temperature, and/or fault condition thresholds associated with an individual cell to reflect the variability of resistance relative to SOC. In particular, the adjustment factors included in the resistance estimation SOC look-up table may be applied in implementations where the SOC of a battery is outside the SOC range where the resistance may be substantially constant relative to SOC (e.g., below a lower SOC threshold 402 and/or above an upper SOC threshold 404) to compensate for the increase in resistance presented by battery cells outside of such an SOC range.

Exemplary embodiments of the present disclosure can also provide similar mechanisms to compensate for the variability of resistance as a function of the age of the battery. Age of a battery may be monitored (e.g., cycles, calendar age, etc.) by a battery management system, and a resistance estimation age look-up table as a function of age may be generated, which may be used in the determination of resistance, temperature, and/or fault condition thresholds. Similar to the generation of a resistance estimation SOC look-up table, simulations and/or testing can be performed to obtain resistance information across multiple batteries and/or cells at various ages. The resistance information can be compiled and aggregated to generate a resistance estimation age look-up table as a function of age. For example, the resistance estimation age look-up table can include adjustment factors for corresponding ages of a battery, which can be applied in the determination of the resistance, temperature, and/or fault condition thresholds associated with an individual cell to reflect the variability of resistance relative to age. In particular, the adjustment factors included in the resistance estimation age look-up table may be applied in implementations where the age of a battery exceeds a predetermined age threshold (e.g., a certain number of cycles, a certain number of days/months/years old, etc.) to compensate for the increase in resistance above an age threshold value.

Figure 5:
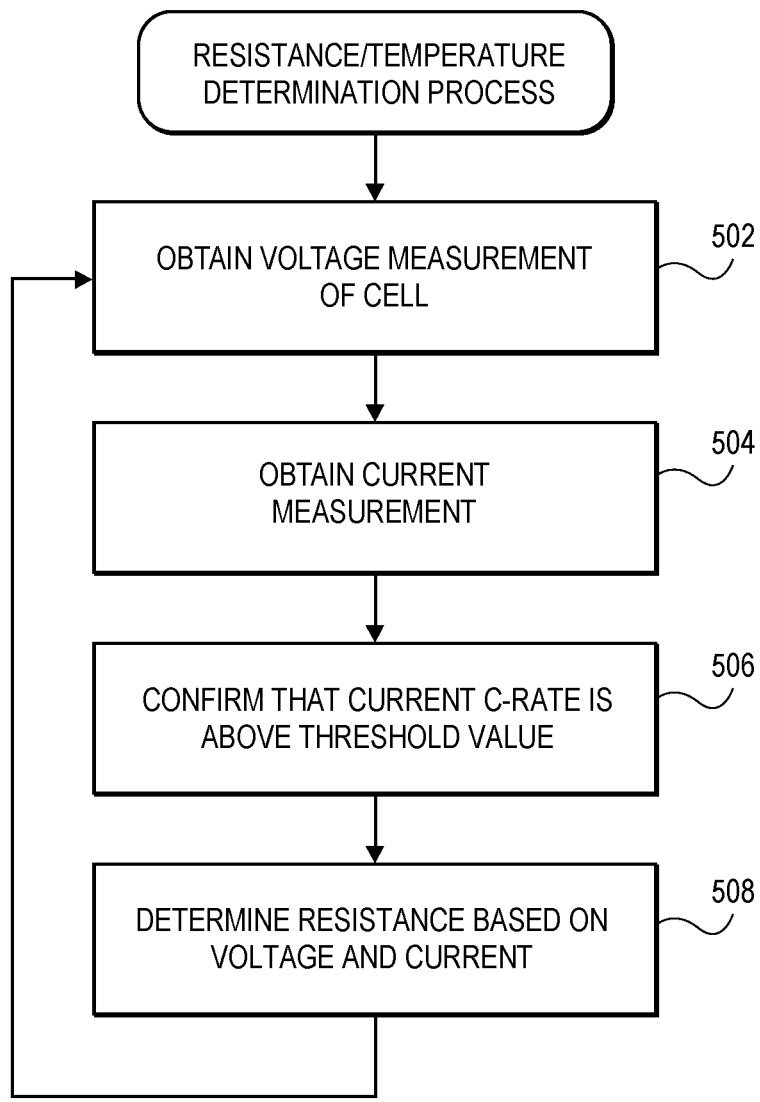
FIG. 5 is a flow diagram of an exemplary resistance and/or temperature determination process of a battery cell, according to exemplary embodiments of the present disclosure.

FIG. 5 is a flow diagram of an exemplary resistance and/or temperature determination process 500 of a battery cell, according to exemplary embodiments of the present disclosure.

As shown in FIG. 5, process 500 may begin at step 502, where a voltage measurement of a battery cell may be obtained. For example, a battery management system may obtain a voltage measurement associated with each individual cell of battery cells connected in series. Accordingly, a voltage measurement may be obtained for each individual cell of the battery.

In step 504, a current measurement may also be obtained. Similarly, the battery management system may obtain a current measurement associated with one or more battery cells connected in series, which may form a battery, a battery pack, or the like. In step 506, it may be determined whether the current C-rate is above a threshold value (e.g., above 0.1 C, above 0.15 C, above 0.2 C, above 0.25 C, above 0.5 C, above 1.0 C, etc.). In the event that the current C-rate is below the threshold value, process 500 may be aborted until the current C-rate is above the threshold value.

After it has been confirmed that the current C-rate is above the threshold value, for each individual cell, based on the current measurement (e.g., associated with the cells connected in series) and the voltage measurement associated with the particular cell, a resistance of the cell may be determined, as in step 508.

According to exemplary embodiments of the present disclosure, each individual cell may be modeled as an R-RC circuit, and resistance of the cell may be determined by applying a filtering technique (e.g., Kalman filtering, LMS filtering, etc.). For example, the representative R-RC circuit can be viewed as a physical filter, and, using Euler's forward method of discretization, the representative R-RC circuit can be represented as a discretized time series as:

$$V[k] = -a_1 V[k-1] + (1+a_1)V_{ocv} - b_0 I[k] - b_1 I[k-1] \quad (3)$$

where:

| Discrete Parameter | Continuous Parameter |
|---|---|
| $b_0$ | $R_0$ |
| $b_1$ | $-R_0 + \dfrac{T(R_0 + R_e)}{R_e C}$ |
| $a_1$ | $-1 + \dfrac{T}{R_e C}$ | and T may represent the sampling time of the battery management system associated with the current and voltage measurements obtained by the battery management system. According to exemplary embodiments of the present disclosure, a filtering technique (e.g., Kalman filtering, LMS filtering, etc.) may be utilized to recursively estimate the parameters associated with exemplary R-RC circuit 300. For example, Equation (3) above can be rewritten in state space form as:

$$V_t[k] + a_1 V_t[k-1] = [1+a_1, -I[k], -I[k-1]] \begin{bmatrix} V_{ocv} \\ b_0 \\ b_1 \end{bmatrix} \quad (4)$$

Accordingly, the filtering technique (e.g., Kalman filtering, LMS filtering, etc.) can be utilized to recursively estimate the values of parameters $V_{OCV}$, $b_0$, and $b_1$. As noted in the table above, $b_0$ may approximate the value of the line resistance $R_0$ of the representative R-RC circuit. Accordingly, in view of the correspondence of $b_0$ with line resistance $R_0$ and the relationship between line resistance $R_0$ and temperature, $b_0$ can be utilized to estimate the resistance and/or temperature of each individual cell. The determined resistance can be an estimation of and/or representative of the temperature of the cell, and the battery management system can compare the resistance and/or temperature of each individual cell against a fault condition threshold to determine whether a thermal fault condition is triggered based on the estimated resistance and/or temperature.

Figure 6:
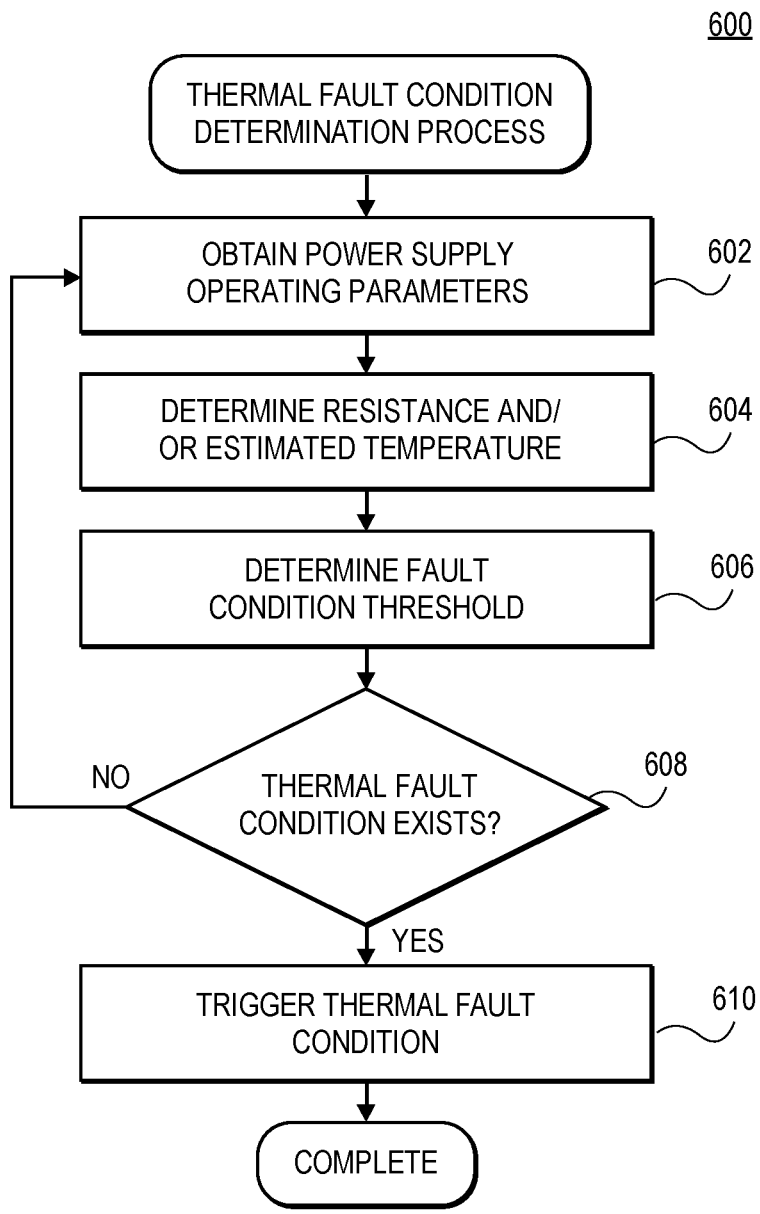
FIG. 6 is a flow diagram of an exemplary thermal fault condition determination process, according to exemplary embodiments of the present disclosure.

FIG. 6 is a flow diagram of an exemplary thermal fault condition determination process 600, according to exemplary embodiments of the present disclosure.

As shown in FIG. 6, process 600 may begin at step 602, where operating parameters and/or characteristics associated with a power supply may be obtained. This may include, for example, a voltage measurement at each individual cell of the power supply, a current measurement of the current produced by the power supply, an SOC associated with the battery, an age of the power supply, a battery C-rate associated with the battery, and the like.

Based on the operating parameters and/or characteristics (e.g., the voltage measurement and the current measurement), a resistance and/or temperature for each individual cell of the power supply may be determined, as in step 604. According to exemplary embodiments of the present disclosure, each individual cell may be modeled as an R-RC circuit, and resistance of each individual cell may be determined by applying a filtering technique (e.g., Kalman filtering, LMS filtering, etc.). Accordingly, the resistance associated with each individual cell may approximate and/or represent an estimated relative temperature of the corresponding cell.

In step 606 a fault condition threshold may be determined. For example, a predetermined fault condition threshold may first be determined in view of the correlation between resistance of individual cells of a power supply and the temperature of the individual cells. The predetermined fault condition threshold may correspond to a thermal anomaly condition under certain operating conditions of the battery. This may include, for example, operating conditions where the SOC of the power supply is in a range where the relationship between resistance and temperature of the cells of the power supply is substantially constant, where the age of the power supply is below a threshold value (e.g., a threshold indicating nearly end of life of the power supply) such that the resistance of the cells of the power supply has not substantially increased, a battery current C-rate is above a threshold value, and the like. Accordingly, based on certain operating characteristics and/or parameters of the power supply, such as SOC, age, battery current C-rate, and the like, the predetermined fault condition threshold may be adjusted to compensate for variabilities in the resistance of the battery cells.

For example, an adjustment factor may be obtained from a resistance estimation SOC look-up table for corresponding SOCs values of a battery, which can be applied in the determination of the resistance, temperature, and/or fault condition thresholds associated with an individual cell to reflect the variability of resistance relative to SOC. The resistance estimation SOC look-up table can include adjustment factors for corresponding SOCs of a battery, which can be applied in the determination of the resistance, temperature, and/or fault condition thresholds associated with an individual cell to reflect the variability of resistance relative to a battery's SOC. In particular, the adjustment factors included in the resistance estimation SOC look-up table may be applied in implementations where the SOC of a battery is outside an SOC range where the resistance may be substantially constant relative to SOC (e.g., below a lower SOC threshold 402 and/or above an upper SOC threshold 404) to compensate for the increase in resistance presented by battery cells outside of such an SOC range.

Similar mechanisms may also be provided to compensate for the variability of resistance as a function of the age of the battery. An age adjustment factor may be obtained from a resistance estimation age look-up table, which may be used in the determination of resistance, temperature, and/or fault condition thresholds. The resistance estimation age look-up table can include adjustment factors for corresponding ages of a battery, which can be applied in the determination of the resistance, temperature, and/or fault condition thresholds associated with an individual cell to reflect the variability of resistance relative to age. In particular, the adjustment factors included in the resistance estimation age look-up table may be applied in implementations where the age of a battery exceeds a predetermined age threshold (e.g., a certain number of cycles, a certain number of days/months/years old, etc.) to compensate for the increase in resistance above an age threshold value.

Alternative mechanisms may also be provided to compensate for the variability of resistance as a function of the age of the battery. According to another implementation of the present disclosure, measured temperature information may be obtained from one or more thermal sensors (e.g., thermocouples, etc.) associated with cells of the battery and used to compensate for the variability of resistance as a function of the age of the battery. The measured temperature information can facilitate a determination of the effect aging has had on the resistance of the cells that have thermal sensors. For example, if a particular resistance R (e.g., 3.5 mΩ) was expected to correlate to a certain temperature T (e.g., 45° C.), but the determined resistance and measured temperature are yielding different results (e.g., resistance of 4.0 mΩ and 45° C.), an adjustment factor (e.g., a multiplier) can be determined from the difference between the expected and measured values. Accordingly, the adjustment factor can be applied to all cells of the battery, since it may be assumed that all cells of the battery are of a similar age and may experience similar variabilities in their resistances as a function of age.

Alternatively and/or in addition, rather than applying various adjustment factors to the fault condition thresholds, corresponding adjustment factors may be applied to the resistance and/or temperature determined in step 604. For example, the resistance and/or temperature determined in 604 may be adjusted with adjustment factors to account for variabilities experienced in the resistance of individual battery cells in view of SOC, age, battery current C-rate, and other operating characteristics and/or parameters of the power supply.

According to yet another exemplary embodiment of the present disclosure, rather than apply adjustment factors to at least one of the fault condition thresholds and/or the determined resistance and/or temperature, various operating conditions thresholds may be established such that monitoring and/or detection for a thermal anomaly is not performed outside of the operating condition thresholds. For example, monitoring and/or detection for a thermal anomaly may not be performed if the SOC of the power supply is outside of the range of SOC in which the resistance of each individual cell is substantially constant as a function of SOC (e.g., between lower threshold 402 and upper threshold 404), the age of the power supply exceeds a threshold age, the battery current C-rate is below a threshold rate, and the like.

After the fault condition threshold has been determined, in step 608, it can be determined whether a thermal fault condition exists. For example, the resistance and/or temperature can be compared against the fault condition threshold to determine whether a thermal fault condition exists. According to certain aspects of the present disclosure, comparison of the resistance and/or temperature of each individual cell against the fault condition threshold may include a delay, count, or other mechanism to ensure that the thermal anomaly is persistent for a predetermined period prior to triggering of the fault condition. Alternatively and/or in addition, the resistance of each individual cell can be compared against the resistance of the cells that have thermal sensors (assuming it is known that they are not experiencing a thermal anomaly based on the temperature measurement). If the difference between the resistance of a cell without a thermal sensor and the resistance of the cells with thermal sensors exceeds a differential threshold value, it may indicate that the cell is experiencing a thermal anomaly. Alternatively, if the difference in resistances is within the differential threshold value, it may indicate that the cell is not experiencing a thermal fault condition. Accordingly, if it is determined that a thermal fault condition exists, a thermal fault condition may be triggered, as in step 610. If not, process 600 may return to step 602, so that it may continuously monitor for and detect a thermal anomaly.

Figure 7:
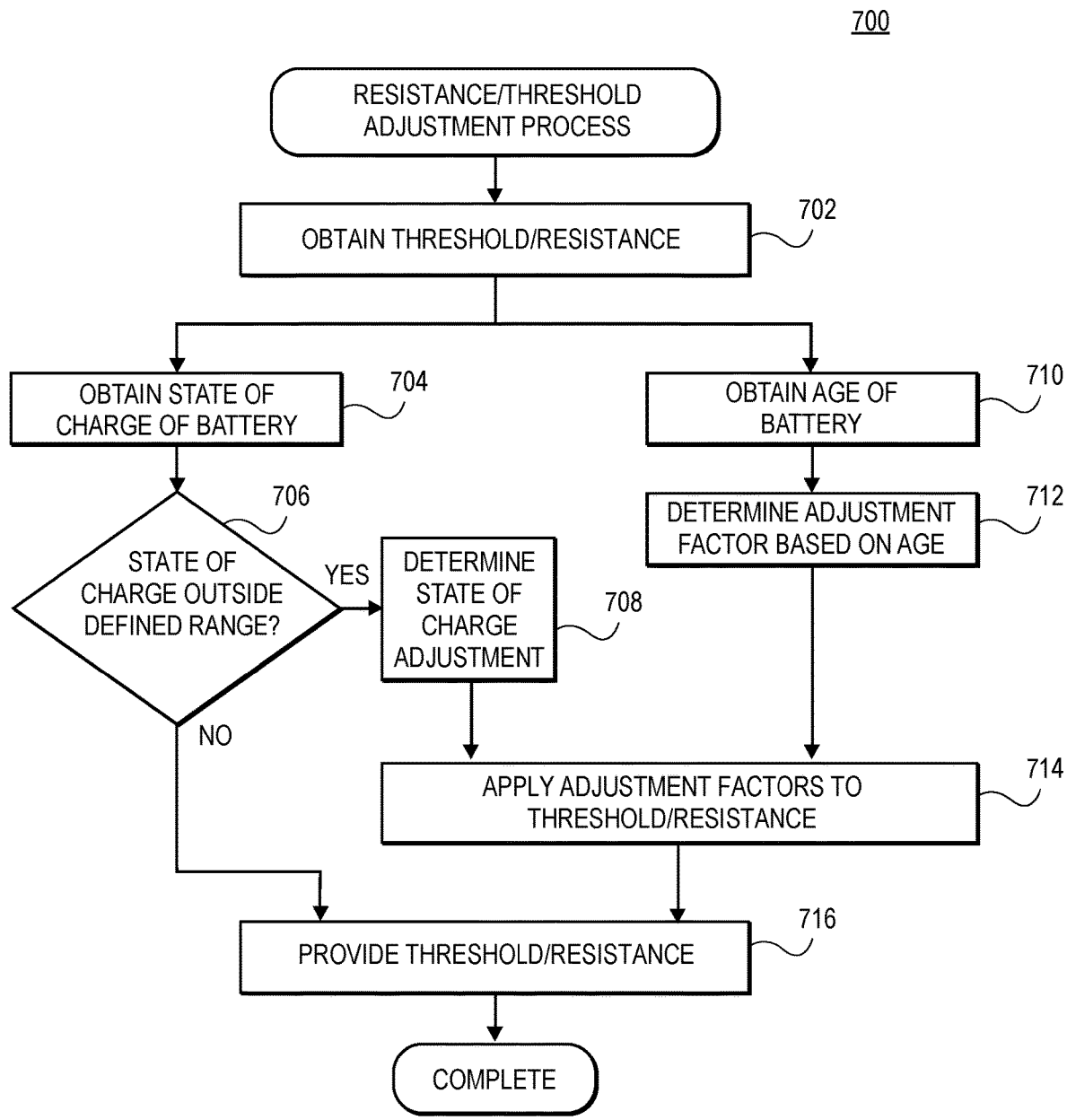
FIG. 7 is a flow diagram of an exemplary resistance and/or threshold adjustment process, according to exemplary embodiments of the present disclosure.

FIG. 7 is a flow diagram of an exemplary resistance and/or threshold adjustment process 700, according to exemplary embodiments of the present disclosure.

As shown in FIG. 7, process 700 may begin at step 702, where the determined resistance and/or an initial fault condition threshold may be obtained. In steps 704 and 710, certain operating parameters of the battery, such as state of charge of the battery and age of the battery, may be obtained, respectively.

In step 706, it can be determined whether the state of charge of the battery is outside a defined range. For example, the defined range may correspond to a range of SOC of the battery where the resistance may be substantially constant relative to SOC. If the state of charge is within the range, no adjustment is made for SOC, and the determined resistance and/or initial fault condition threshold is provided, in step 716.

If the SOC of the battery is outside of the defined range, a state of charge adjustment may be determined, as in step 708. For example, an adjustment factor may be obtained from a resistance estimation SOC look-up table for corresponding SOCs values of a battery, to compensate for the variability (e.g., increase) of resistance relative to SOC outside of the defined range. The resistance estimation SOC look-up table can include adjustment factors for corresponding SOCs of a battery, which can be applied in the determination of the resistance, temperature, and/or fault condition thresholds associated with an individual cell to reflect the variability of resistance relative to a battery's SOC. After the adjustment factor has been determined, it may be applied to the determined resistance and/or initial fault condition threshold, as in step 714, prior to providing the determined resistance and/or initial fault condition threshold, as in step 716.

Similarly, in connection with adjustments for age of the battery, after the age of the battery is obtained in step 710, an adjustment factor based on the age may be determined, as in step 712. For example, an age adjustment factor may be obtained from a resistance estimation age look-up table as a function of age. The resistance estimation age look-up table can include adjustment factors for corresponding ages of a battery, which can be applied in the determination of the resistance, temperature, and/or fault condition thresholds associated with an individual cell to reflect the variability of resistance relative to age. In particular, the adjustment factors included in the resistance estimation age look-up table may be applied in implementations where the age of a battery exceeds a predetermined age threshold (e.g., a certain number of cycles, a certain number of days/months/years old, etc.) to compensate for the increase in resistance above an age threshold value. Alternatively, the age adjustment factor may be determined based on a differential between an expected resistance to temperature relationship and a measured resistance to temperature relationship (e.g., based on measured values from cells having a thermal sensor). An adjustment factor (e.g., a multiplier) can be determined from the difference between the expected and measured values.

After the adjustment factor has been determined, it may be applied to the determined resistance and/or initial fault condition threshold, as in step 714, prior to providing the determined resistance and/or initial fault condition threshold, as in step 716.

Figure 8:
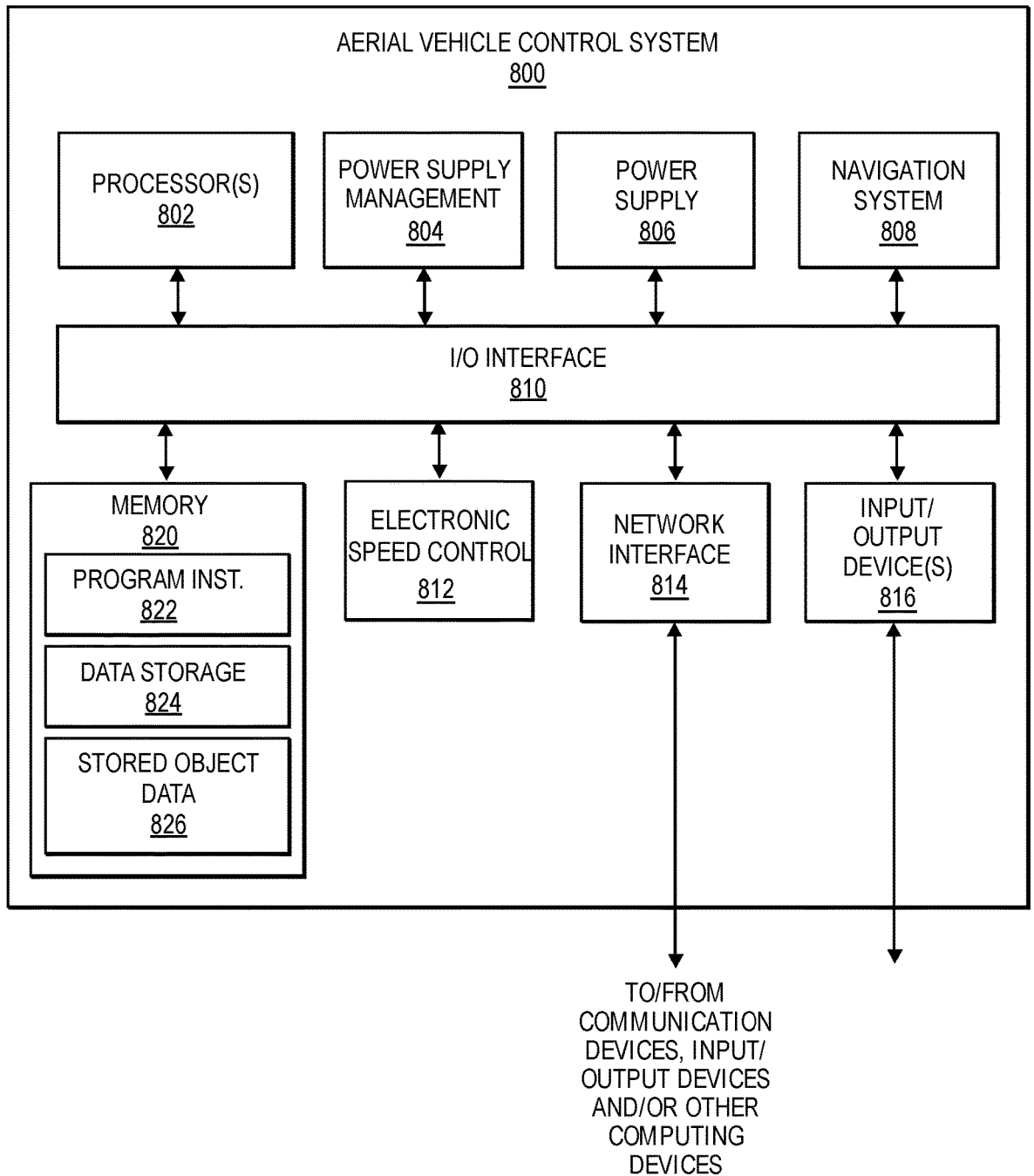
FIG. 8 is a block diagram illustrating various components of an exemplary aerial vehicle control system, according to exemplary embodiments of the present disclosure.

FIG. 8 is a block diagram illustrating various components of an exemplary aerial vehicle control system 800, according to exemplary embodiments of the present disclosure.

In various examples, the block diagram may be illustrative of one or more aspects of the aerial vehicle control system 800 that may be used to implement the various systems and processes discussed above. In the illustrated implementation, the aerial vehicle control system 800 includes one or more processors 802, coupled to a non-transitory computer readable storage medium 820 via an input/output (I/O) interface 810. The aerial vehicle control system 800 may also include one or more power supply management systems 804 (e.g., battery management system), a power supply or battery 806, navigation system 808, and/or electronic speed control 812. The aerial vehicle control system 800 may further include network interface 814 and one or more input/output devices 816.

In various implementations, the aerial vehicle control system 800 may be a uniprocessor system including one processor 802, or a multiprocessor system including several processors 802 (e.g., two, four, eight, or another suitable number). The processor(s) 802 may be any suitable processor capable of executing instructions. For example, in various implementations, the processor(s) 802 may be general-purpose or embedded processors implementing any of a variety of instruction set architectures (ISAs), such as the x86, PowerPC, SPARC, or MIPS ISAs, or any other suitable ISA. In multiprocessor systems, each processor(s) 802 may commonly, but not necessarily, implement the same ISA.

The non-transitory computer readable storage medium 820 may be configured to store executable instructions, data, and historical flight information and/or motor information, including efficiency data, torque constant data, expected power consumed/load presented/current drawn by each of the motors, expected thrust generated by each of the motors, function/purpose of the thrust generated by each of the motors (e.g., to generate lift, yaw/pitch/roll control, etc.), the operating condition of the UAV (e.g., cruise flight, take-off, landing, hover flight, weather conditions, etc.), and/or other data items accessible by the processor(s) 802. In various implementations, the non-transitory computer readable storage medium 820 may be implemented using any suitable memory technology, such as static random-access memory (SRAM), synchronous dynamic RAM (SDRAM), nonvolatile/Flash-type memory, or any other type of memory. In the illustrated implementation, program instructions and data implementing desired functions, such as those described above, are shown stored within the non-transitory computer readable storage medium 820 as program instructions 822, data storage 824, and stored object data 826, respectively. In other implementations, program instructions and/or stored data may be received, sent or stored upon different types of computer-accessible media, such as non-transitory media, or on similar media separate from the non-transitory computer readable storage medium 820 or the aerial vehicle control system 800.

Generally, a non-transitory, computer readable storage medium may include storage media or memory media such as magnetic or optical media, e.g., disk or CD/DVD-ROM, coupled to the aerial vehicle control system 800 via the I/O interface 810. Program instructions and data stored via a non-transitory computer readable medium may be transmitted by transmission media or signals, such as electrical, electromagnetic, or digital signals, which may be conveyed via a communication medium such as a network and/or a wireless link, such as may be implemented via the network interface 814.

In one implementation, the I/O interface 810 may be configured to coordinate I/O traffic between the processor(s) 802, the non-transitory computer readable storage medium 820, and any peripheral devices, the network interface or other peripheral interfaces, such as input/output devices 816. In some implementations, the I/O interface 810 may perform any necessary protocol, timing or other data transformations to convert data signals from one component (e.g., non-transitory computer readable storage medium 820) into a format suitable for use by another component (e.g., processor(s) 802). In some implementations, the I/O interface 810 may include support for devices attached through various types of peripheral buses, such as a variant of the Peripheral Component Interconnect (PCI) bus standard or the Universal Serial Bus (USB) standard, for example. In some implementations, the function of the I/O interface 810 may be split into two or more separate components, such as a north bridge and a south bridge, for example. Also, in some implementations, some or all of the functionality of the I/O interface 810, such as an interface to the non-transitory computer readable storage medium 820, may be incorporated directly into the processor(s) 802.

Electronic speed control system 812 communicates with the navigation system 808 and adjusts the operational characteristics of each propulsion mechanism to guide the aerial vehicle along a determined path and/or to perform other navigational maneuvers. The navigation system 808 may include a GPS, IMU, altimeter, speed sensors, or other similar system than can be used to navigate the aerial vehicle to and/or from a location.

Aerial vehicle control system 800 may also include power supply management system 804 that communicates with the processor(s) 802, the non-transitory computer readable storage medium 820, power supply 806, and/or other components or systems described herein to provide monitoring and detection of thermal anomalies for each individual cell of power supply 806.

The network interface 814 may be configured to allow data to be exchanged between the aerial vehicle control system 800, other devices attached to a network, such as other computer systems, imaging sensors, and/or control systems of other vehicles, systems, machines, equipment, apparatuses, or devices. For example, the network interface 814 may enable wireless communication between numerous aerial vehicles. In various implementations, the network interface 814 may support communication via wireless general data networks, such as a Wi-Fi network. For example, the network interface 814 may support communication via telecommunications networks such as cellular communication networks, satellite networks, and the like.

Input/output devices 816 may, in some implementations, include one or more displays, imaging sensors, image capture devices, voltage sensing devices, current sensing devices, thermal sensors, infrared sensors, time of flight sensors, accelerometers, pressure sensors, weather sensors, various other sensors described herein, etc. Multiple input/output devices 816 may be present and controlled by the aerial vehicle control system 800. One or more of these sensors may be utilized to assist in performing the various functions, operations, and processes described herein.

As shown in FIG. 8, the memory may include program instructions 822, which may be configured to implement the example processes and/or sub-processes described above. The data storage 824 may include various data stores for maintaining data items that may be provided for performing the various functions, operations, and processes described herein. For example, the data storage 824 may include stored object data 826, such as a resistance estimation SOC look-up table, resistance estimation age look-up table wind data, failure condition data, DC current information, voltage information, current information, thermal information, temperature information, age of battery information, SOC information, and/or other data items.

It should be understood that, unless otherwise explicitly or implicitly indicated herein, any of the features, characteristics, alternatives or modifications described regarding a particular embodiment herein may also be applied, used, or incorporated with any other embodiment described herein, and that the drawings and detailed description of the present disclosure are intended to cover all modifications, equivalents and alternatives to the various embodiments as defined by the appended claims. Moreover, with respect to the one or more methods or processes of the present disclosure described herein, including but not limited to the processes represented in FIGS. 5-7, orders in which such methods or processes are presented are not intended to be construed as any limitation on the claimed invention, and any number of the method or process steps or boxes described herein can be combined in any order and/or in parallel to implement the methods or processes described herein. Also, the drawings herein are not drawn to scale.

Conditional language, such as, among others, "can," "could," "might," or "may," unless specifically stated otherwise, or otherwise understood within the context as used, is generally intended to convey in a permissive manner that certain embodiments could include, or have the potential to include, but do not mandate or require, certain features, elements and/or steps. In a similar manner, terms such as "include," "including" and "includes" are generally intended to mean "including, but not limited to." Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," or "at least one of X, Y and Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

Language of degree used herein, such as the terms "about," "approximately," "generally," "nearly" or "substantially" as used herein, represent a value, amount, or characteristic close to the stated value, amount, or characteristic that still performs a desired function or achieves a desired result. For example, the terms "about," "approximately," "generally," "nearly" or "substantially" may refer to an amount that is within less than 10% of, within less than 5% of, within less than 1% of, within less than 0.1% of, and within less than 0.01% of the stated amount.

Although the invention has been described and illustrated with respect to illustrative embodiments thereof, the foregoing and various other additions and omissions may be made therein and thereto without departing from the spirit and scope of the present disclosure.

What is claimed is:

1. A system, comprising:
a battery including a plurality of cells connected in series;
a battery management system configured to, at least:
obtain a current measurement associated with the battery;
for each of the plurality of cells:
obtain a respective voltage measurement associated with the cell;
recursively determine, using a filtering technique and based at least in part on the current measurement and the respective voltage measurement, a resistance associated with the cell, wherein the resistance is representative of a respective temperature associated with the cell;
adjust at least one of the resistance or a fault threshold based on at least one of a state of charge of the battery or an age of the battery; and
compare the resistance associated with the cell against the fault threshold;
detect, based at least in part on the comparison of each resistance associated with each of the plurality of cells against the fault threshold, a thermal anomaly associated with at least one cell of the plurality of cells.

2. The system of claim 1, wherein the detection of the thermal anomaly is performed without using a thermal sensor to obtain a direct temperature measurement of the at least one cell.

3. The vehicle of claim 1, wherein the battery management system is further configured to determine that a battery current rate is above a battery current rate threshold.

4. The system of claim 1, wherein the adjustment of at least one of the resistance or the fault threshold includes:
determining, based at least in part on the state of charge of the battery or the age of the battery, an adjustment factor from at least one lookup table including a plurality of adjustment factors corresponding to a plurality of state of charges and a plurality of ages.

5. The system of claim 1, further comprising:
a thermal sensor coupled to a first cell of the plurality of cells,
wherein the adjustment of at least one of the resistance or the fault threshold is based at least in part on a temperature measurement associated with the first cell obtained from the thermal sensor and a respective resistance determined for the first cell.

6. A battery management system, comprising:
one or more processors; and
a memory storing program instructions that, when executed by the one or more processors, cause the one or more processors to at least:
obtain a respective voltage measurement associated with each of a plurality of serially connected cells of a battery;
obtain a current measurement associated with the plurality of serially connected cells of the battery;
determine, based at least in part on each respective voltage measurement associated with each of the plurality of serially connected cells of the battery and the current measurement, a respective resistance associated with each of the plurality of serially connected cells of the battery, wherein each respective resistance is representative of a respective temperature associated with each of the plurality of serially connected cells of the battery; and
determine, based at least in part on a first resistance associated with a first cell of the plurality of serially connected cells, that the first cell is experiencing a thermal anomaly condition.

7. The battery management system of claim 6, wherein the determination that the first cell is experiencing the thermal anomaly condition is performed without using a thermal sensor to obtain a direct temperature measurement of the first cell.

8. The battery management system of claim 6, wherein the determination of each respective resistance includes:
modeling each of the plurality of serially connected cells as an RC circuit;
discretizing the RC circuit to obtain a discretized representation of the RC circuit; and
applying a filtering technique to the discretized representation of the RC circuit to recursively determine each respective resistance.

9. The battery management system of claim 6, wherein the determination that the first cell is experiencing the thermal anomaly condition includes:
obtaining, from a thermal sensor associated with a second cell of the plurality of serially connected cells, a temperature of the second cell;
determining a second resistance associated with the second cell; and
determining that a difference between the first resistance and the second resistance exceeds a differential threshold.

10. The battery management system of claim 6, wherein:
the determination that the first cell is experiencing the thermal anomaly condition includes comparing the first resistance against a thermal anomaly threshold; and
the program instructions that, when executed by the one or more processors, further cause the one or more processors to at least:
obtain a state of charge (SOC) of the battery;
determine that the SOC of the battery is outside of a predetermined range of SOC; and
apply an adjustment factor to at least one of the first resistance or the thermal anomaly threshold.

11. The battery management system of claim 10, wherein the adjustment factor includes a first adjustment factor from a plurality of adjustment factors, wherein the first adjustment factor corresponds to the SOC of the battery.

12. The battery management system of claim 10, wherein the adjustment factor is based on a temperature measurement obtained from a thermal sensor associated with a second cell of the plurality of serially connected cells and a second resistance determined for the second cell.

13. The battery management system of claim 6, wherein:
the determination that the first cell is experiencing the thermal anomaly condition includes comparing the first resistance against a thermal anomaly threshold; and
the program instructions that, when executed by the one or more processors, further cause the one or more processors to at least:
obtain an age of the battery;
determine that the age of the battery is above an age threshold value; and
apply an adjustment factor to at least one of the first resistance or the thermal anomaly threshold.

14. The battery management system of claim 6, wherein the program instructions that, when executed by the one or more processors, further cause the one or more processors to at least:
prior to determination of each respective resistance associated with each of the plurality of serially connected cells of the battery, determine that a current C-rate of the battery is above a current rate threshold.

15. A method for detecting a thermal anomaly condition, comprising:
obtaining a first voltage measurement associated with a first cell of a plurality of serially connected cells of a battery;
obtaining a current measurement associated with the plurality of serially connected cells of the battery;
applying a filtering technique to recursively determine, based at least in part on the first voltage measurement and the current measurement, a first resistance associated with the first cell, wherein the first resistance is representative of a first temperature of the first cell;
determining, based at least in part on the first resistance, that the first cell is experiencing a thermal anomaly; and
triggering, based on the determination that the first cell is experiencing the thermal anomaly, a fault condition.

16. The method of claim 15, wherein the determination of the thermal anomaly is performed without using a thermal sensor to obtain a direct temperature measurement of the first cell.

17. The method of claim 15, wherein triggering the fault condition includes applying at least one of a delay, a counter, or a filter to determine a persistence of the thermal anomaly.

18. The method of claim 15, wherein determining that the first cell is experiencing the thermal anomaly includes comparing the first resistance against a thermal anomaly threshold; and
the method further comprises:
obtaining a state of charge (SOC) of the battery;
determining that the SOC of the battery is outside of a predetermined range of SOC; and
applying an adjustment factor to at least one of the first resistance or the thermal anomaly threshold,
wherein:
the adjustment factor includes a first adjustment factor from a plurality of adjustment factors, and
the first adjustment factor corresponds to the SOC of the battery.

19. The method of claim 15, wherein determining that the first cell is experiencing the thermal anomaly includes comparing the first resistance against a thermal anomaly threshold; and
the method further comprises:
obtaining an age of the battery;
determining that the age of the battery exceeds an age threshold; and
applying an adjustment factor to at least one of the first resistance or the thermal anomaly threshold,
wherein:
the adjustment factor includes a first adjustment factor from a plurality of adjustment factors, and
the first adjustment factor corresponds to the age of the battery.

20. The method of claim 15, wherein determining that the first cell is experiencing the thermal anomaly includes:
obtaining, from a thermal sensor associated with a second cell of the plurality of serially connected cells, a temperature of the second cell;
determining a second resistance associated with the second cell; and
determining that a difference between the first resistance and the second resistance exceeds a differential threshold.

* * * * *